United States Patent [19]

Robinson et al.

[11] 3,955,091

[45] May 4, 1976

[54] METHOD AND APPARATUS FOR EXTRACTING WELL-FORMED, HIGH CURRENT ION BEAMS FROM A PLASMA SOURCE

[75] Inventors: William P. Robinson, Austin, Tex.; Robert L. Seliger, Agoura, Calif.

[73] Assignee: Accelerators, Inc., Austin, Tex.

[22] Filed: Nov. 11, 1974

[21] Appl. No.: 522,796

[52] U.S. Cl. .............................. 250/423; 315/111.3

[51] Int. Cl.$^2$ ........................ H01J 7/24; H01J 37/08

[58] Field of Search ........... 250/423, 424, 426, 427, 250/425; 313/360, 363, 231; 315/111.2, 111.3

[56] References Cited

UNITED STATES PATENTS

| | | | |
|---|---|---|---|
| 2,845,539 | 7/1958 | Robinson | 250/427 |
| 3,355,615 | 11/1967 | Bihan | 250/423 |
| 3,585,397 | 6/1971 | Brewer | 250/492 A |

*Primary Examiner*—Craig E. Church

*Attorney, Agent, or Firm*—Arnold, White & Durkee

[57] ABSTRACT

A well-formed ion beam having a high current is extracted from an ion plasma by a low perveance ion extraction system including focus and extraction electrodes, the extraction electrode having an ion exit aperture and being axially spaced from the focus electrode a distance of at least several times the diameter of the ion exit aperture. A voltage differential is applied between the electrodes to define a plasma sheath at the ion source aperture, and the ion beam is extracted from the plasma sheath.

8 Claims, 3 Drawing Figures

METHOD AND APPARATUS FOR EXTRACTING WELL-FORMED, HIGH CURRENT ION BEAMS FROM A PLASMA SOURCE

BACKGROUND OF THE INVENTION

The present invention is directed generally to apparatus and methods for the extraction of ion beams from a plasma, and, more particularly, to methods and apparatus for extraction of well-formed, high current ion beams from a plasma utilizing a high extraction voltage in a low perveance extraction system.

The generation of initially well-formed ion beams is essential in ion implantation systems where efficient beam transport is required, and in ion microscopes where high brightness is desirable. In a typical ion implantation system with good beam collimation, the beam is usually transported over a long path, typically 3 to 4 meters. The beam path may include a mass analyzer, deflector plates for beam rastering, and drift regions. The beam transport and handling along this path has generally resulted in a significant loss of beam current. This loss of beam current is particularly significant when a high current beam of ions, such as boron, phosphorous, or arsenic, is desired for applications such as ion implantation. Accordingly, extraction of well-formed, high current ion beams having small divergence and less aberration than those heretofore obtained by conventional extraction techniques is desired to minimize beam current losses in subsequent beam manipulation.

SUMMARY OF THE INVENTION

It is a principal object of the present invention to provide a method and apparatus for the extraction of well-formed high energy ion beams having greater intensity and less divergence and distortion than those produced by current methods and apparatus. In one embodiment of the present invention, a well-formed, high current ion beam is extracted from an electron bombardment (Penning) ion source (plasma generator) by a low perveance ion extraction system. The ion extraction system includes a focus electrode having an ion source aperture and an extraction electrode having an ion exit aperture, the extraction electrode being axially spaced from the ion source aperture a distance of at least 5 times the radius of the ion exit aperture. A predetermined voltage differential is applied between the electrodes and the plasma generator is activated. The ions are extracted from the plasma and passed through the apertures of the focusing and extraction electrodes to define a well-formed beam. The electron perveance of the extraction system is maintained below about $5 \times 10^{-8}$ $AV^{-3/2}$. The electrode configurations are of the single aperture Pierce type, the equipotential lines produced between them being generally normal to the ion beam axis. The low perveance extraction of the ions by a Pierce type electrode configuration results in the production of a well-formed beam of high current ions for use in applications such a ion implantation.

BRIEF DESCRIPTION OF THE DRAWING

So that the present invention may be understood in detail, a more particular description of the invention may be had by reference to the illustrative embodiment shown in the appended drawing, which forms a part of this specification. It is to be noted, however, that the drawing illustrates only a typical embodiment of the invention, and is not to be considered limiting of its scope, for the invention may admit to other equally effective embodiments.

DETAILED DESCRIPTION

Figure 1:
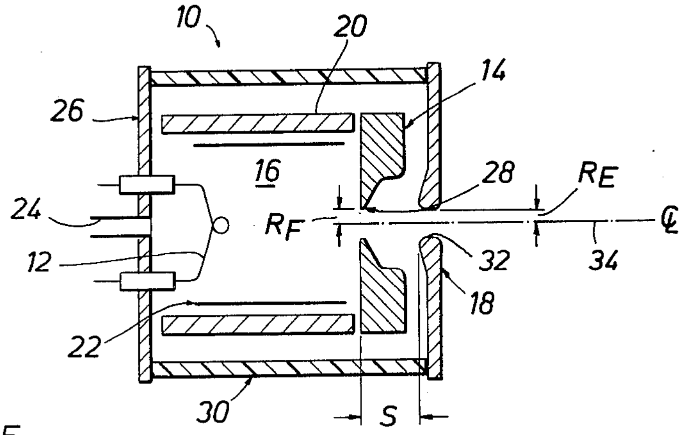
FIG. 1 is a partial sectional view of a plasma ion generator and extraction system in accordance with one embodiment of the present invention.

The conventional approach to the extraction of ion beams for ion implantation employs a high perveance extraction system in which a relatively low extraction potential of, for example 20 kV is applied between closely spaced electrodes to produce the electric field gradient required to extract a beam of the desired current density. The ratio of the electrode spacing to the aperture radius in conventional ion extraction apparatus is usually less than 1.0, and often less than 0.5. The effect of the small ratio of extraction aperture to electrode spacing is to distort the equipotential lines between the electrodes and in the extraction aperture. The resulting nonparallel transverse electric field lines cause the ion trajectories to diverge outwardly at a short distance downstream from the source. The subsequent correction of these ion beam optical defects or aberrations introduced into the beam by the aperture distortion in the extraction region is virtually impossible, and the refocusing of the beam results in large beam current and/or power losses. In addition, the close electrode spacing has limited the extraction potentials which can be applied between the electrodes without arcing or undesirable beam distortion. This in turn limits the ion beam currents which can be achieved in reasonably well-formed beams by such apparatus and methods.

Electron and ion guns have been classified according to a parameter called the perveance, P, which has been defined as the ratio of the current $I_o$ in a beam to the three-halves power of the anode or extractor voltage $V_a$. This parameter is a measure of beam flux or field density, and is familiar from its use in connection with space-charge-limited diodes and similar devices where it is a function of only the geometric structure. In describing electron and ion extraction apparatus, the extraction electrode voltage, V, is used in place of $V_a$, and the parameter is expressed as electron perveance, $P_{e-}$.

In prior art apparatus, one objective has been to get $P_{e-}$ as high as possible to extract the greatest number of ions from the source for a given extraction voltage.

The problem of distortion of the equipotential lines in high perveance ion extraction systems is particularly severe when a plasma source, rather than a geometrically definite solid source, is employed. When the extraction voltage is applied, the source plasma forms a sheath covering the focusing electrode (ion source) aperture. The shape of the exposed surface of the sheath varies with changes in operating conditions, such as the ion density of the plasma, the extraction voltage potential, and the shape of the electric field lines in close proximity to the ion source aperture. The ions are extracted from that portion of the sheath facing the aperture, and their initial direction is largely determined by the shape of the sheath. Increased electric field gradients cause the sheath to become more concave. As the ion trajectories are formed normal to the sheath surface, attempts to produce high current ion beams by increasing the extractor voltage have heretofore resulted in distorted ion trajectories and diverging beams. Consequently, the current of the acceptably well-formed ion beams which have been producible by conventional methods and apparatus has been limited.

In one embodiment of the present invention, a hot filament electron bombardment (Penning) ion generator of the type currently used in ion implantation apparatus is coupled with a low perveance ion extraction system to produce a well-formed beam of high current ions.

Referring now to FIG. 1 of the drawing, one embodiment of apparatus for generating a well-formed beam of high current ions according to the present invention includes ion source means, generally indicated by reference numeral 10, in combination with Pierce geometry focus and extraction electrodes 14 and 18 respectively. The ion source means is a conventional hot filament electron bombardment Penning ion source, including a source base 26 having a gas inlet 24 through which the source feed gas is supplied. Filament 12 is mounted in the source base and provides a source of bombarding electrons. Solenoid 20 and anode 22 are of conventional design. The focus electrode 14 is mounted to the ion source opposite the gas inlet, and defines an ion source aperture 28 having a radius $R_F$ as shown. The extraction electrode 18 is mounted to the ion source base by insulator 30, which supports the extraction electrode as will be discussed below. The plasma is generated in conventional fashion in the chamber indicated by reference numeral 16.

The extraction electrode defines an exit aperture 32, coaxial with the ion source aperture and having a radius $R_E$ as shown. The extraction electrode is spaced from the ion source aperture along the ion beam centerline 34 at distance S which is at least 5 times the radius $R_E$ of the ion exit aperture.

Although a ratio of electrode spacing S to ion exit aperture radius $R_E$ of at least 5 is preferred, it will be appreciated that ion sources in accordance with the present invention will be effective to produce well-formed ion beams with greater or lesser $S/R_E$ ratios. The ratio of S to $R_E$ in high perveance ion extraction configurations is typically less than 1.0, and the present invention may utilize ratios approaching this value with decreasing benefit. The $S/R_E$ ratio also may be greater than 5, and ratios of 6 to 8 or 10 are satisfactory while larger ratios may be used.

Those skilled in the art will understand that the electrode apertures utilized in ion beam generation are usually circular for convenience, and that other geometrical configurations may be used in some applications. In such cases, the concept of low perveance extraction still applies. For example, in the case of a ribbon beam, the ratio of the electrode spacing to the ribbon width should be at least five.

In addition to supporting the extraction electrode, the insulator 30 electrically isolates the extraction electrode from the focus electrode. While the ion source means has been shown as a hot filament electron bombardment plasma generator, it will be appreciated that numerous conventional plasma generators may be utilized for production of the desired ion plasma. For example, glow discharge, arc discharge, radio frequency, or compound sources combining the foregoing may be utilized in combination with the electrode arrangement of the present invention in the low perveance extraction of desired ion beams.

As discussed above, perveance is a parameter related to the number of ions which may be extracted at a given extraction voltage. Although the term is usually expressed in terms of electron perveance for convenience, and denoted $P_{e-}$, it will be appreciated that corresponding perveances may be determined for given ion beams extracted according to the relationship $$P_i = P_{e-}\ M_i/M_{e-}\ 1/2$$

in which $P_i$ represents the perveance of the desired ion and $M_i$ and $M_{e-}$ represent the mass of the extracted ions and of electrons respectively.

It will be understood that ion sources or generators which produce a plasma from which the ion beam is extracted usually produce a mixture of ions. The electrons which ionize the feed gas to sustain the plasma will ionize all sorts of molecules and atoms present in the discharge chamber, including the impurities in the feed gas. In addition to the desired ion species, such as for example 11B+ obtained on the ionization of $BF_3$ feed gas, other ion species can come from the disassociation of the $BF_3$ and other gases in the discharge chamber. In the case of $BF_3$, the desired B+ ion comprises less than 10 percent of the extracted beam, the predominant ion being $BF_2$+. While the extracted beam will contain a variety of ions, it is clear that all of the ions are extracted from the plasma sheath and the extracted beam current will refer to this combined beam. The total current, considering all of the ions in the extracted beam, will obey the space-charge-limited relationship on the basis of an equivalent mass. In ion implantation apparatus, the extracted beam is typically passed through an analyzing magnet to separate the desired ion species from the remainder of the extracted beam. The resulting analyzed beam of desired ions is then further manipulated to deliver the desired ion beam to the implantation target with minimum loss of current.

In the illustrated embodiment of the present invention the perveance is about $3.5 \times 10^{-8}$ $AV^{-3/2}$. The $P_{e-}$ may range from as high as about $10 \times 10^{-8}$ $AV^{-3/2}$ to as low as about $10^{-8}$ $AV^{-3/2}$, although a value below about $5 \times 10^{-8}$ is preferred.

Figure 2:
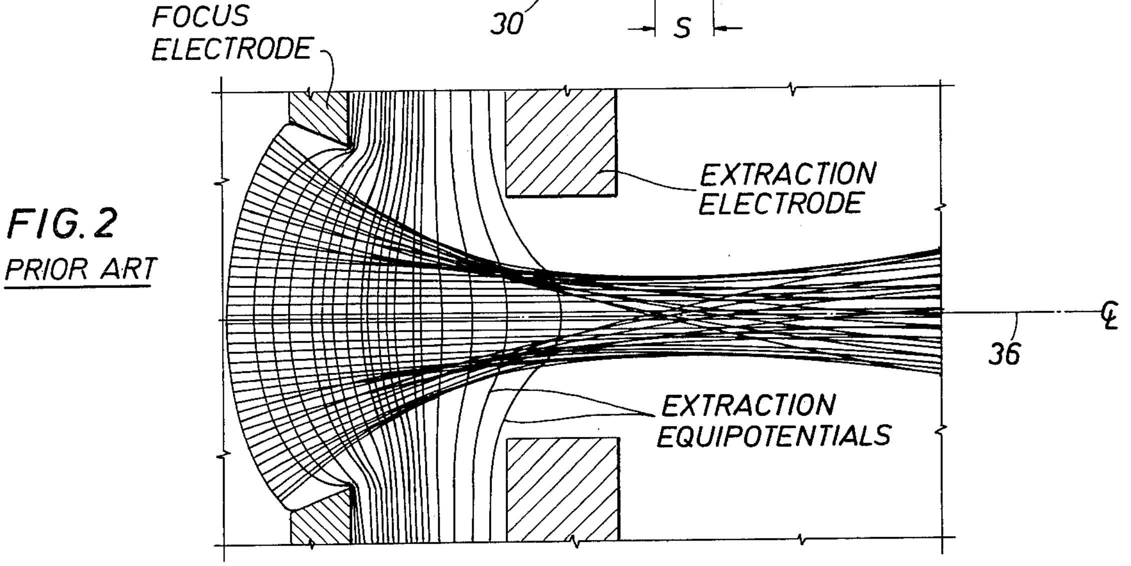
FIG. 2 PRIOR ART
FIG. 2 is a schematic representation of high perveance ion extraction from a plasma source utilizing prior art conventionally shaped and spaced electrodes.

FIG. 2 is a schematic representation of a conventional high perveance extraction system, $P_{e-} = 1 \times 10^{-6}$ $AV^{-3/2}$, applied to the production of an ion beam from a plasma source. It is readily apparent that the resulting beam contains high aberrations as evidenced by the trajectory crossovers, and that it diverges downstream of the extraction electrode.

Figure 3:
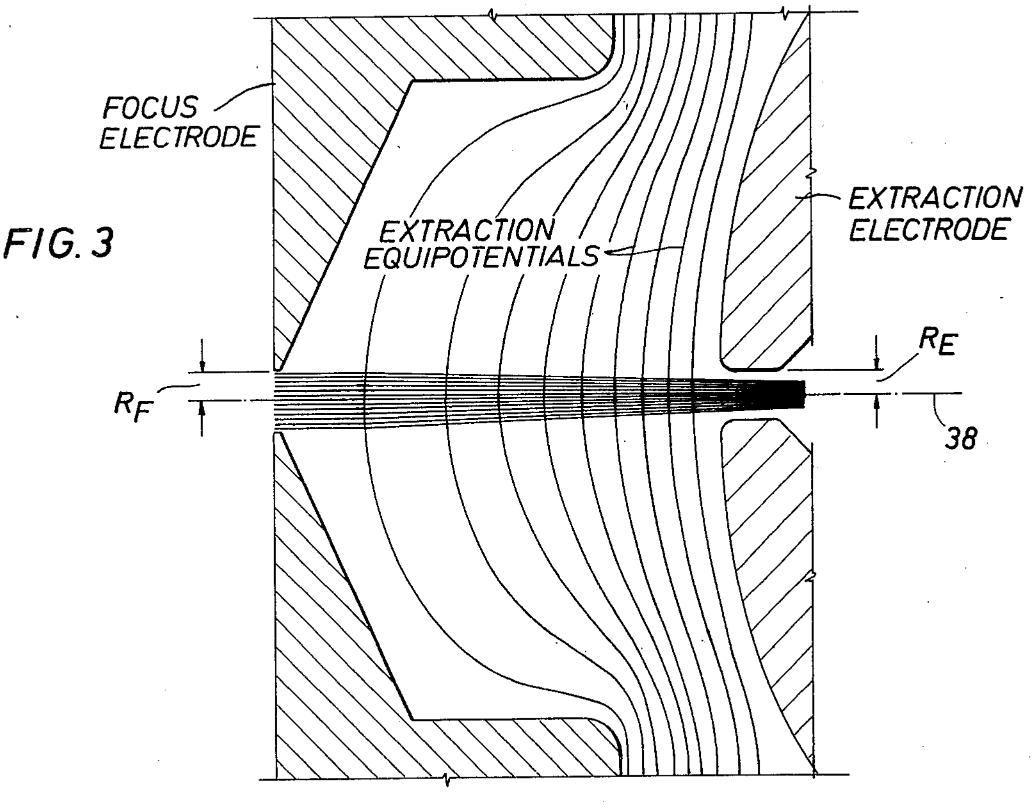
FIG. 3 is a schematic representation of low perveance ion extraction from a plasma generator utilizing the apparatus of FIG. 1.

In order to avoid the aberrations and divergencies experienced with prior art extraction systems such as illustrated in FIG. 2, the Pierce electrode configuration of FIG. 3 is employed in the present invention. As can be seen in FIG. 3, this electrode arrangement provides equipotential lines that are generally more normal to the ion beam trajectories than in FIG. 2. This tends to eliminate much of the divergent flow of ions. By extracting an initially well-formed beam having small divergence and less aberration than those obtained using conventional extraction techniques, more effective utilization of plasma generators can be made and less beam current is lost in the subsequent beam manipulation necessary in ion implantation. Substantially all of the extracted ions of the desired species are delivered to the target after analysis in the present invention.

Operation of ion beam sources in accordance with the present invention is distinctly different from that of prior art apparatus. It will be appreciated that theoretical or empirical curves of beam current versus extraction voltage may be developed for individual ion beam sources according to the present invention so that an operator may determine the proper extraction voltage to be applied to generate a beam of the desired current. In this fashion the ion beam source may be operated so as to maintain the plasma sheath in approximately fixed relation to the ion source aperture over a wide range of extraction voltages.

After the high voltage, on the order of 20–100 kV, is applied to the extraction electrode, the plasma is formed in the discharge chamber 16. The extraction electrode is held at a negative potential with respect to the plasma, and the resulting potential gradient extracts a portion of the ions from the plasma. The extracted ions then pass through the ion source and exit apertures of the respective electrodes and form the extracted ion beam. The focus electrode has a small aperture in its center in order to pass the ions, for example from about 1.0 to 8.0 mm in diameter, although larger or smaller apertures may be used. The small ion source aperture of the present invention minimizes the effect of increased extraction voltage on the plasma sheath. Also, the greater spacing of the electrodes and the large ratios of electrode spacing to ion exit aperture radius permit the application of much greater extraction voltages without arcing between the electrodes or unacceptable distortion of the beam. In the illustrated embodiment of the present invention, for example, extraction voltages of up to 100 kV may be applied to a $BF_3$ plasma source to extract an ion beam of 6 to 8 milliamperes while maintaining a well formed beam for ion implantation purposes. This extracted beam then is analyzed to yield a $B^+$ ion beam of from about 150 to as much as 400 microamperes at the implantation target.

It will be appreciated that the low perveance ion extraction configuration is geometrically quite different from the conventional high perveance configuration normally used with ion beams. Low perveance electrode configurations are characterized by a large ratio of the distance of the extraction electrode from the source ion exit to the radius of the aperture in the extraction electrode. This ratio should be greater than about 5 in the present invention, and may be as high as 8 to 10, or higher. It will be understood that the improved results achieved by apparatus and methods according to the present invention will occur over a range of spacing to aperture area ratios, and the lower limit of 5 referred to herein is not an absolute limit. Rather the ratio of 5 is a value below which the results achieved are less advantageous in most applications than those achieved when the ratio is 5 or greater.

The high extraction voltages which are applied in the method and apparatus of the present invention offer a significant additional advantage in applications calling for well-formed, high-energy ion beams. In the prior art the extraction voltages which can be applied to produce a well-formed, relatively undistorted ion beam were limited to 20–30kV. When higher beam energies were required, the use of accelerator tubes was necessary to raise the energy of the extracted beam to the required level, and this additional beam handling caused further loss of beam current. In the present invention, where extraction voltages of up to 100kV or more may be utilized, the need for further acceleration of the beam to achieve desired beam energies is reduced by as much as a factor of 5 or more, if not eliminated, and the quality of the resulting beam is greatly enhanced.

What is claimed is:

1. Apparatus for generating a well-formed, high current ion beam from an ion plasma, comprising in combination a focus electrode defining an ion source aperture, an ion plasma generator disposed proximate the ion source aperture for generating an ion plasma, and an extraction electrode defining an ion exit aperture, the ion exit aperture being axially aligned with the ion source aperture and spaced therefrom a distance at least five times the radius of the ion exit aperture to define ion extraction optics having an electron perveance $P_{e-}$ of not greater than $5 \times 10^{-8}$ $AV^{-3/2}$ wherein A is the unit current in amperes and V is the applied extraction voltage in volts.

2. Apparatus for generating a well-formed, high current ion beam from an ion plasma as recited in claim 1 wherein the ion plasma generator comprises a hot filament electron bombardment ion generator.

3. Apparatus for generating a well-formed, high current ion beam from an ion plasma as recited in claim 2 wherein the ion source aperture diameter is from about 1.0 to about 8.0mm.

4. In apparatus for generating a beam of selected ions from an ion plasma, including a focus electrode defining an ion source aperture, an ion plasma generator for producing a plasma including the selected ions, and an ion extraction electrode spaced from the focus electrode and defining an ion exit aperture coaxial with the ion source aperture, the improvement wherein the extraction electrode is spaced from the ion source aperture a distance of at least five times the radius of the ion exit aperture to define a low perveance ion extraction system wherein the electron perveance is between $1.0 \times 10^{-8}$ $AV^{-3/2}$ and $10.0 \times 10^{-8}$ $AV^{-3/2}$, A representing the unit current in amperes and V representing the applied extraction voltage in volts.

5. In an ion implantation apparatus for delivering a beam of selected ions to an implantation target, including an ion plasma generator for producing a plasma including the selected ions, a focus electrode disposed proximate the ion plasma generator and defining an ion source aperture communicating with the plasma, an extraction electrode spaced from the focus electrode and defining an ion exit aperture coaxial with the ion source aperture for the extraction of an ion beam from the plasma, and an ion beam analyzer for analyzing the extracted ion beam to produce a beam of the selected ions, the improvement comprising location of the extraction electrode at a distance of at least five times the radius of the ion exit aperture from the focus electrode along the axis of the extracted beam for forming a low perveance ion extraction system and for defining a well-formed, high current beam of the selected ions wherein the electron perveance is between $1.0 \times 10^{-8}$ $AV^{-3/2}$ and $10.0 \times 10^{-8}$ $AV^{-3/2}$, A representing the unit current in amperes and V representing the applied extraction voltage in volts.

6. A method for generating a well-formed, high current beam of selected ions from an ion plasma for implantation in a target material comprising the steps of:

applying a predetermined extraction voltage to low perveance ion extraction optics including an extraction electrode and a focus electrode to produce a potential difference therebetween, the focus electrode having an ion source aperture proximate an ion plasma generator for producing a plasma containing the selected ions and the extraction electrode defining an ion exit aperture coaxial with the ion source aperture and spaced from said focus electrode a distance of at least five times the radius of the ion exit aperture for defining an ion extraction system wherein the electron perveance is between $1.0 \times 10^{-8} AV^{-3/2}$ and $10.0 \times 10^{-8} AV^{-3/2}$, A representing the unit current in amperes and V representing the applied extraction voltage in volts;

operating the ion plasma generator to produce a plasma including the selected ions;

extracting a well-formed, high current ion beam including the selected ions;

analyzing the extracted ion beam to produce a beam containing only the selected ions; and transporting the analyzed beam to a target for implantation therein of the selected ions.

7. A method for generating a well-formed, high current ion beam from an ion plasma as recited in claim 6 wherein the applied extraction voltage is between 20 kV and 100 kV.

8. A method for generating a well-formed, high current ion beam from an ion plasma as recited in claim 7 wherein the plasma is boron trifluoride and the current of the extracted beam is at least 4 milliamperes.

* * * * *

UNITED STATES PATENT OFFICE
CERTIFICATE OF CORRECTION

Patent No. 3,955,091 Dated May 4, 1976

Inventor(s) William P. Robinson and Robert L. Seliger

It is certified that error appears in the above-identified patent and that said Letters Patent are hereby corrected as shown below:

In the Specification:

Column 4, line 14, "$P_i = P_{e-} M_i/M_{e-}$ 1/2"

should read -- $P_i = P_{e-}(M_i/M_{e-})^{1/2}$ --.

Signed and Sealed this

Seventh Day of September 1976

[SEAL]

*Attest:*

RUTH C. MASON
*Attesting Officer*

C. MARSHALL DANN
*Commissioner of Patents and Trademarks*